(12) United States Patent
Saito

(10) Patent No.: US 6,770,145 B2
(45) Date of Patent: Aug. 3, 2004

(54) LOW-PRESSURE CVD APPARATUS AND METHOD OF MANUFACTURING A THIN FILM

(75) Inventor: Masayuki Saito, Kanagawa (JP)

(73) Assignee: Tanaka Kikinzoku Kogyo K.K., Tokyo (JP)

(*) Notice: Subject to any disclaimer, the term of this patent is extended or adjusted under 35 U.S.C. 154(b) by 0 days.

(21) Appl. No.: 10/000,009

(22) Filed: Dec. 4, 2001

(65) Prior Publication Data

US 2002/0069825 A1 Jun. 13, 2002

Related U.S. Application Data

(60) Provisional application No. 60/254,193, filed on Dec. 11, 2000.

(51) Int. Cl.[7] ........................... C23C 16/18; C23C 16/00
(52) U.S. Cl. ....................................... 118/726; 118/715
(58) Field of Search ............................ 137/156, 157, 137/158, 159, 160, 170.6; 118/61, 715, 716, 717, 718, 719, 720, 722, 726

(56) References Cited

U.S. PATENT DOCUMENTS

| | | | | |
|---|---|---|---|---|
| 4,469,720 A | * | 9/1984 | Morris | 427/345 |
| 4,897,096 A | * | 1/1990 | Pischinger et al. | 55/283 |
| 5,015,503 A | * | 5/1991 | Varrin et al. | 117/99 |
| 5,303,558 A | * | 4/1994 | Caton et al. | 62/55.5 |
| 5,575,853 A | * | 11/1996 | Arami et al. | 118/708 |
| 5,649,428 A | * | 7/1997 | Calton et al. | 62/94 |
| 5,704,214 A | * | 1/1998 | Fujikawa et al. | 62/55.5 |
| 5,766,683 A | * | 6/1998 | Waibel | 427/252 |
| 5,819,683 A | * | 10/1998 | Ikeda et al. | 118/724 |
| 5,950,675 A | * | 9/1999 | Minami et al. | 137/606 |
| 5,958,510 A | * | 9/1999 | Sivaramakrishnam et al. | 427/255.6 |
| 6,007,330 A | * | 12/1999 | Gauthier | 432/47 |
| 6,077,562 A | * | 6/2000 | Dornfest et al. | 427/255.28 |
| 6,086,711 A | * | 7/2000 | Kanishak et al. | 156/345.29 |
| 6,107,198 A | * | 8/2000 | Lin et al. | 438/680 |
| 6,159,298 A | * | 12/2000 | Saito | 118/715 |
| 6,197,119 B1 | * | 3/2001 | Dozoretz et al. | 118/715 |
| 6,238,514 B1 | * | 5/2001 | Gu | 156/345.29 |
| 6,361,607 B2 | * | 3/2002 | Dozoretz et al. | 118/715 |
| 6,402,806 B1 | * | 6/2002 | Schmitt et al. | 75/414 |
| 6,506,352 B1 | * | 1/2003 | Lindfors et al. | 423/240 S |
| 2001/0017080 A1 | * | 8/2001 | Dozoretz et al. | 96/108 |
| 2002/0053191 A1 | * | 5/2002 | Gu | 55/282 |
| 2003/0037730 A1 | * | 2/2003 | Yamasaki et al. | 118/715 |

* cited by examiner

Primary Examiner—Jeffrie R. Lund
Assistant Examiner—Rudy Zervigon
(74) Attorney, Agent, or Firm—Rothwell Figg Ernst & Manbeck

(57) ABSTRACT

An LPCVD apparatus comprising: a container for accommodating an organometallic compound which serves as a raw material; a heating means for heating the container and vaporizing the organometallic compound to obtain a raw material gas; a reactor for accommodating a substrate on which a thin film being precipitated; an exhaust pump for maintaining a low pressure atmosphere within the reactor; and a trap provided on the upstream side of the exhaust pump and cooling used raw material gas supplied from the reactor. In the reactor, the trap is provided with honeycomb-structure cylindrical fillers in a flowing passage through which the used raw material flows. The LPCVD apparatus according to the present invention enables recovery of a larger amount of used raw material without reducing its exhaust efficiency.

7 Claims, 4 Drawing Sheets

(a) At the Start of the Operation of the Apparatus (b) Manufacturing a Thin Film (c) Replacement of Substrate / Reduction of the Internal Pressure in the Reactor Again

LOW-PRESSURE CVD APPARATUS AND METHOD OF MANUFACTURING A THIN FILM

This nonprovisional application claims the benefit of U.S. Provisional Application No. 60/254,193, filed Dec. 11, 2000.

BACKGROUND OF THE INVENTION

1. Technical Field of the Invention

The present invention relates to an apparatus for carrying out a process for forming a metal film or a metallic compound film with the use of LPCVD method, also relates to a method for controlling the film formation process.

2. Description of the Related Art

Since chemical vapor deposition method (hereinafter referred to as CVD method) can be used to produce a uniform film, and since CVD method has an excellent capability called "step coverage" which can be effectively used to form a uniform film on an uneven surface, this method has become one of generally used thin film formation techniques for forming thin film electrodes in a semiconductor device.

A thin film formation process involved in the CVD method requires that after a raw material has been vaporized and moved to the surface of a substrate, the particles of the raw material are caused to react with one another on the substrate so as to be accumulated thereon. Particularly, in recent years, there has been in use a low pressure CVD method (hereinafter referred to as LPCVD method) which takes into account the manufacturing of a thin film at a lower temperature but with a higher efficiency, and enables the above reaction to be conducted in an atmosphere having a reduced pressure. Further, in order to reduce the reaction temperature, as a metallic compound for use as a raw material, there has been in use an organometallic compound.

Here, an apparatus for manufacturing a thin film using the LPCVD method, is comprised of a container for accommodating an organometallic compound as a raw material, a heating device for heating the container to vaporize the organometallic compound so as to obtain a raw material gas, and a reactor accommodating a substrate for precipitating a thin film, with all of them being communicated in a predetermined manner by virtue of various pipes. In addition, the LPCVD apparatus is equipped with an exhaust pump which is used to maintain a low pressure atmosphere within the reactor. Furthermore, in order for the exhaust pump to be kept at a high exhaust efficiency and in order to prevent any possible failure during the operation of the exhaust pump, there has been in use a trap (cold trap) for removing in advance some condensed components from the exhaust gas.

However, the inventors of the present invention have recently developed a recycle technique in order to solve an existing problem, i.e., the cost for manufacturing a thin film is relatively high because of a low efficiency in using the raw material compound in the CVD method. According to the improved recycle technique of the invention, the raw material used in the above reaction is recovered, and an un-reacted metallic compound is refined from the used and recovered raw material so that the un-reacted metallic compound can be processed into a reusable form. Moreover, the inventors of the present invention have found it effective to use a trap to recover the used raw material, because the use of the trap makes it easy to effect the recovery of the used raw material. Namely, a raw material compound (organometallic compound) used in the CVD method usually has a relatively low boiling point and a relatively low vapor pressure, so that such a raw material compound is easy to undergo a phase change at a relatively low temperature and thus it may be easily condensed from its gaseous phase into its liquid phase. Accordingly, if taking into account the original purpose of using a trap, a trap may be considered to be an excellent device for recovering the used raw material. Besides, since an LPCVD apparatus is usually equipped with a trap, it is not necessary to provide another trap to effect the recovery of the used raw material.

On the other hand, when using the recycle technique described in the above, it is usually desired to recover as much as possible the used raw material in order to be able to recycle as much as possible the metallic compound. Accordingly, in order to increase the recovery amount when recovering the used raw material, it is usual to consider increasing the capacity of a trap.

However, an increase in the capacity of a trap will undesirably cause an increase in the size of a CVD apparatus, thus causing an increase in the equipment cost. Moreover, an increase in the capacity of a trap can also reduce an exhaust efficiency of an exhaust pump, thus undesirably reducing the functions originally provided by the trap.

Accordingly, the present invention is to provide an improved LPCVD apparatus capable of recovering a larger amount of used raw material, without reducing its exhaust efficiency.

SUMMARY OF THE INVENTION

The inventors of the present invention, as a result of investigation for solving the above-described problems, have thought that in order to efficiently recover the used raw material, it is important to increase a cooling efficiency when cooling a used raw material in the trap. Further, as a method for putting such an idea into practical use, the inventors think it is appropriate to fill the gas flowing passage of the trap with an amount of solid fillers. In a commonly used conventional trap, the internal surfaces thereof can serve as effective cooling surfaces. However, since in such a conventional trap there is only a small contact area allowing a contact between a used material and the cooling surfaces, a sufficient cooling of the used raw material is almost impossible. In contrast to this, using an amount of fillers to fill the gas flowing passage of the trap can increase the contact area allowing the desired contact between a used material and the cooling surfaces, thereby ensuring an increased cooling efficiency in the trap.

On the other hand, for use as the fillers it is usual to employ pellet-like materials such as Raschig rings. As this time, in order to increase the cooling efficiency for cooling the used raw material, an amount of fillers are required to be loaded into the trap with a high density. However, if an amount of fillers are loaded into the trap with a high density, a pressure loss across the trap will be large, and this will make it difficult for an exhaust pump to carry out an exhaust operation. As a result, a pressure dropping speed in the reactor will be reduced, bringing about an undesired influence to the reaction in which a thin film is formed. For this reason, the commonly used pellet-like fillers are considered to be not appropriate for being loaded into the trap.

For the above reason, the inventors of the present invention think that it is preferable to use some cylindrical fillers having a honeycomb structure, which can server as the fillers capable of efficiently cooling the used raw material, without bringing about any unfavourable influence to the exhaust efficiency of the exhaust pump.

Namely, the present invention relates to an LPCVD apparatus which comprises a container for accommodating an organometallic compound serving as a raw material, a heating device for heating the container to vaporize the organometallic compound so as to obtain a raw material gas, and a reactor containing a substrate for precipitating a thin film, an exhaust pump for maintaining a low pressure atmosphere within the reactor, a cooling trap provided on the upstream side of the exhaust pump for cooling used raw material gas supplied from the reactor. In particular, the LPCVD apparatus is characterized in that a raw material flowing passage within the trap is filled with an amount of cylindrical fillers having a honeycomb structure.

The fillers having a honeycomb structure which can be suitably used in the present invention are so formed that the cross section of each filler has a plurality of holes formed therethrough, with these holes extending in the longitudinal direction (along which the used raw material gas flows) of each cylindrical filler. Therefore, if an amount of fillers to be used are those having such a honeycomb structure, it is possible to prevent an undesired increase in the pressure loss of the raw material gas passing therethrough. Further, since the fillers of the honeycomb structure have a great number of holes surrounded by partition walls, it is allowed for each piece of filler to have a large surface area. Accordingly, the fillers of the honeycomb structure can be considered to be excellent as having an excellent cooling efficiency for cooling the used raw material gas.

As may be understood from the above description, the LPCVD apparatus of the present invention is capable of reducing the internal pressure in the reactor with an exhaust efficiency which is the same as that of the conventional LPCVD apparatus, thereby exhibiting the same efficiency for manufacturing the thin film as in the conventional apparatus. Meanwhile, using the LPCVD apparatus of the present invention makes it possible to recover the used raw material with an efficiency higher than that in the prior art. Therefore, it has become possible to recycle a large amount of raw material metallic compound, thus making it possible to reduce the cost for manufacturing the thin film.

As to a material forming the fillers of the honeycomb structure for filling the trap, it is preferable to employ a metal. This is because a metal usually has a high thermal conductivity, so that using a metal to form the fillers makes it possible to efficiently cool the used raw material. Further, as to the size of the fillers, it is preferable that the length thereof is in a range of 0.01 to 1.0 m. If the length is shorter than 0.01 m, it will be difficult to effect a sufficient cooling of the used raw material. On the other hand, if the length is longer than 1.0 m, not only an undesired influence will be brought about to the cooling efficiency, but also the trap has to be made large in its size and this will cause a decrease in the exhaust efficiency. Besides, as to the size of the holes formed in each filler of the honeycomb structure, it is preferable that the diameter of the holes is in a range of 0.5 to 10 mm. If the hole diameter is smaller than 0.5 mm, a pressure loss caused due to the fillers will be large, and the holes will get choked by the used and condensed raw material. On the other hand, if the hole diameter is larger than 10 mm, it will be difficult to cool the used raw material to a sufficient extent.

During the thin film formation process using the LPCVD apparatus of the present invention, an internal pressure in the trap is preferred to be kept at a value which is equal to or slightly lower than an internal pressure in the reactor. Since most of the metallic compounds (organic compounds) used in the CVD method have a relatively low vapor pressure, they are not easy to be condensed under a low pressure and at a low temperature. As a result, it is necessary for the internal pressure in the trap to be kept at a relatively high value. In practice, the internal pressure in the trap is preferred to be kept in a range having a lower limit which is equal to or higher than 0.1 Pa, and an upper limit which is equal to or higher than the internal pressure in the reactor.

Furthermore, if taken into account the control of the internal pressure in the trap, the LPCVD apparatus of the present invention is preferred to be equipped with a trap pressure regulating valve which is located between the trap and the exhaust pump for adjusting the internal pressure in the trap. Further, it is preferable to provide a by-pass pipe between the reactor and the exhaust pump. In this way, the internal pressure in the trap is allowed to be maintained at a value which is equal to or slightly lower than the internal pressure in the reactor. Namely, during the process of manufacturing the thin film using the LPCVD apparatus of the present invention, the trap pressure regulating valve is operated by being opened and closed properly, so that an amount of an exhaust gas discharged from the trap can be regulated and the internal pressure in the trap may be controlled within the above-described desired range. On the other hand, the discharge of the exhaust gas from the reactor can be continued exactly by virtue of the by-pass pipe provided between the reactor and the exhaust pump (even if the trap pressure regulating valve is in its closed position), thereby making it possible to constantly maintain the internal pressure in the trap. For example, if the internal pressure in the trap becomes lower than a required value, the pressure regulating valve may be closed so as to shut off the trap. At this time, since the discharge of the exhaust gas from the reactor can be continued by way of the by-pass pipe, it is allowed to continue the thin film formation process without increasing the internal pressure in the reactor.

Further, in order to replace a treated substrate with an untreated one, an actual process for manufacturing a thin film is usually carried out in a manner of one batch after another, in which the operation of the CVD apparatus is stopped temporarily and the reactor is at first opened and then closed for replacing a treated substrate with an untreated one. At this time, whenever the reactor is at first opened and then closed, it is necessary that the reactor be at first subjected to a pressure reduction and then to a pressure increase. In fact, a conventional LPCVD apparatus is so formed that when the internal pressure in the reactor is increased, the internal pressure in the trap will also be increased at the same time. In this way, if it is desired to again reduce the internal pressure in the reactor, the internal pressure in the trap is also needed to be reduced. Different from the conventional LPCVD apparatus, the LPCVD apparatus of the present invention is equipped with a pressure regulating valve on the downstream side of the trap, as well as a by-pass pipe connected between the reactor and the exhaust pump. Thus, by properly operating the pressure regulating valve and the by-pass pipe, it is possible to carry out the thin film manufacturing process with a high efficiency. Namely, since the pressure regulating valve is made operative only during the thin film manufacturing process, and since the pressure regulating valve is closed when a treated substrate is being replaced by an untreated one (so that the trap is shut off and thus a reduced pressure can be maintained), it is not necessary to discharge an exhaust gas having an amount corresponding to the capacity of the trap (during this time the internal pressure in the reactor is being reduced), thereby making it sure to reduce the internal pressure in the reactor with a high efficiency.

However, in the LPCVD apparatus of the present invention, besides the trap pressure regulating valve and the by-pass pipe, there is also provided a back-flow valve on the upstream side of the trap in order to prevent a back flow of a fluid from the trap. In addition, it is preferable to provide the by-pass shut-off valves for shutting off an undesired by-pass flow so as to prevent a used raw material gas (flowing from the reactor during the thin film manufacturing process) from directly flowing into the exhaust pump.

The thin film manufacturing process using the LPCVD apparatus of the present invention will be described with reference to FIG. 1. The LPCVD apparatus shown in FIG. 1 can be considered to be the most preferable embodiment of the present invention, which comprises a trap pressure regulating valve, a by-pass pipe, a back-flow valve, two by-pass shut-off valves, and a reaction pressure regulating valve for regulating the internal pressure in the reactor.

As shown in FIG. 1, at the start of the operation of the apparatus (as an initial step involved in the thin film manufacturing process), all the valves are opened so as to reduce the internal pressures in both the reactor and the trap, as shown in FIG. 1(a).

Then, after the internal pressure in the reactor has reached a predetermined value suitable for manufacturing a thin film, the raw material gas is introduced and the thin film formation process is started. At this time, the trap pressure regulating valve is opened or closed properly, while at the same time the internal pressure in the trap is monitorred, as shown in FIG. 1(b). Further, the by-pass shut-off valves are closed so as to prevent the used raw material gas (flowing from the reactor) from directly flowing into the exhaust pump.

On the other hand, after the thin film manufacturing process has been finished and a treated substrate within the reactor is to be replaced by a new one, both the trap pressure regulating valve and the back-flow valve are closed so as to shut off the trap, followed by increasing the internal pressure in the reactor. After the new substrate has been attached into the reactor, the internal pressure in the reactor is reduced. At this time, the trap pressure regulating valve is closed, while the by-pass shut-off valves are opened, so that the internal pressure in the reactor is reduced by way of the by-pass shut-off valves, as shown in FIG. 1(c).

However, various valves after the substrate replacement are repeatedly operated through the operations shown in FIGS. 1(b) and 1(c).

EMBODIMENT FOR CARRYING OUT THE INVENTION

First Embodiment

Figure 1:
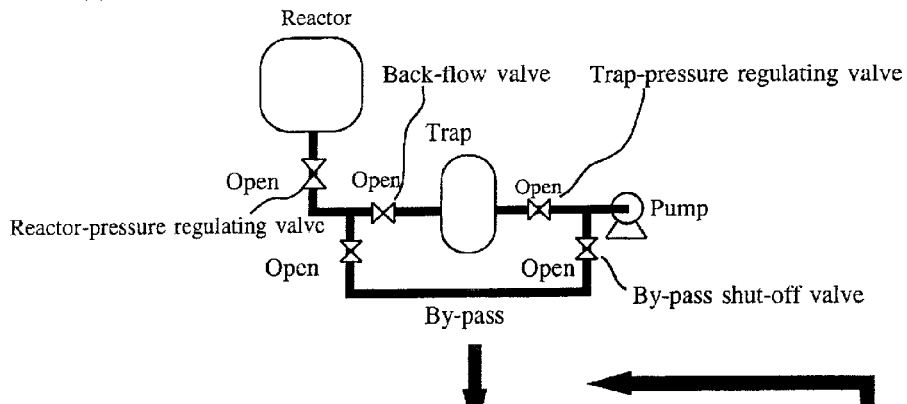
FIG. 1 is a view showing a thin film manufacturing process using the LPCVD apparatus formed according to the present invention.
Figure 1:
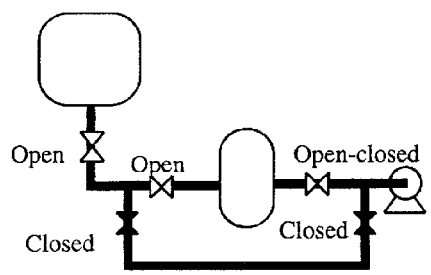
Figure 1:
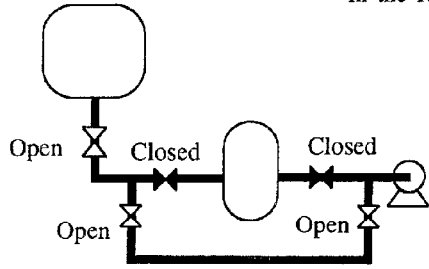
Figure 2:
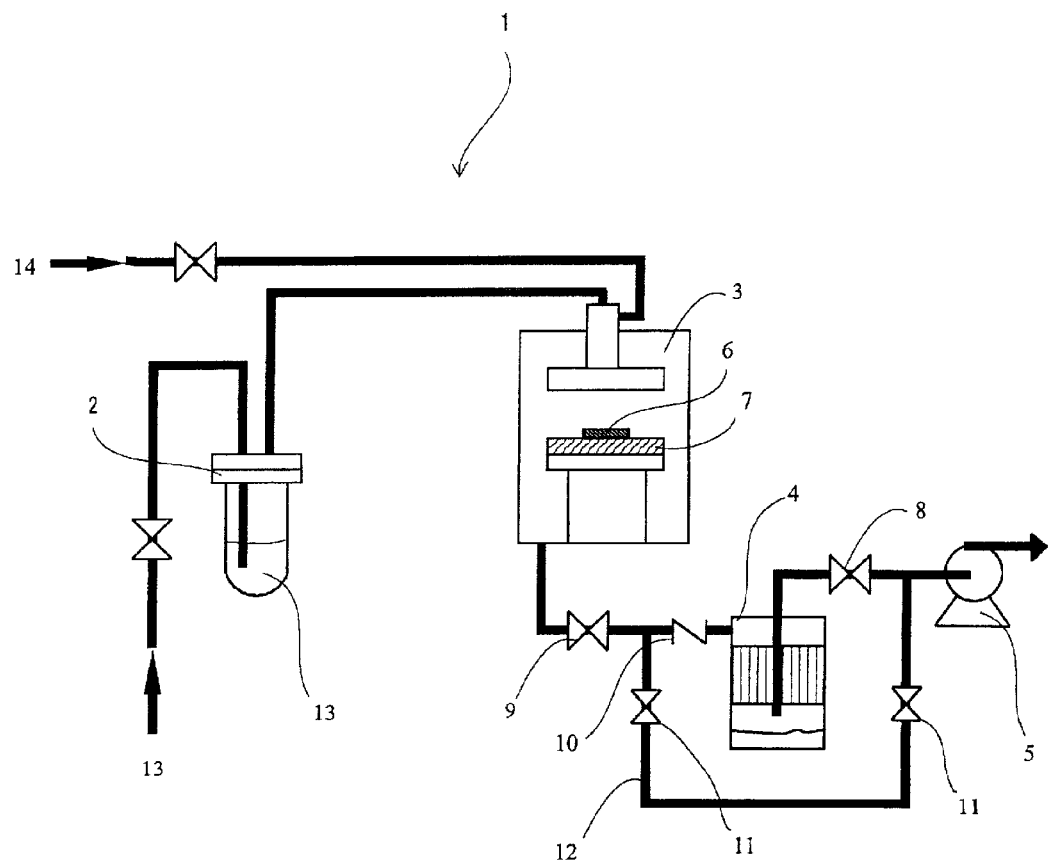
FIG. 2 is a schematic view showing the LPCVD apparatus used in the present embodiment.

FIG. 2 is a schematic view showing an LPCVD apparatus used in the present embodiment. The LPCVD apparatus 1 shown in FIG. 2 comprises a thermostat 2 serving as a container for enclosing an amount of organometallic compound, a reactor 3, a trap 4 for cooling and condensing a raw material gas used in the reaction, and an exhaust pump 5 for reducing an internal pressure in the reactor 3 and an internal pressure in the trap 4. The reactor 3 contains a substrate 6 and a heater 7 for heating the substrate 6. Further, in the present embodiment, a trap pressure regulating valve 8 for regulating an internal pressure in the trap 4 is disposed between the trap 4 and the exhaust pump 5. Moreover, a reactor pressure regulating valve 9 for regulating an internal pressure in the reactor 3 is provided on the downstream side of the reactor 3. A back-flow valve 10 is provided on the upstream side of the trap 4. In addition, between the downstream side of the reactor pressure regulating valve 9 and the upstream side of the exhaust pump 5, there is connected a by-pass pipe 12 having two shutoff valves 11 disposed one on each end thereof.

In the LPCVD apparatus 1, an amount of organometallic compound 13 serving as a raw material is heated in the thermostat 2 so as to be vaporized and thus become a desired raw material gas. The raw material gas is then mixed with an oxygen gas 14 serving as a carrier gas. The mixed gas is then transported to the surface of the substrate 6 disposed within the reactor 3. Afterwards, the substrate 6 is heated by the heater 7 so as to effect a CVD reaction on the surface of the substrate 6.

Figure 3:
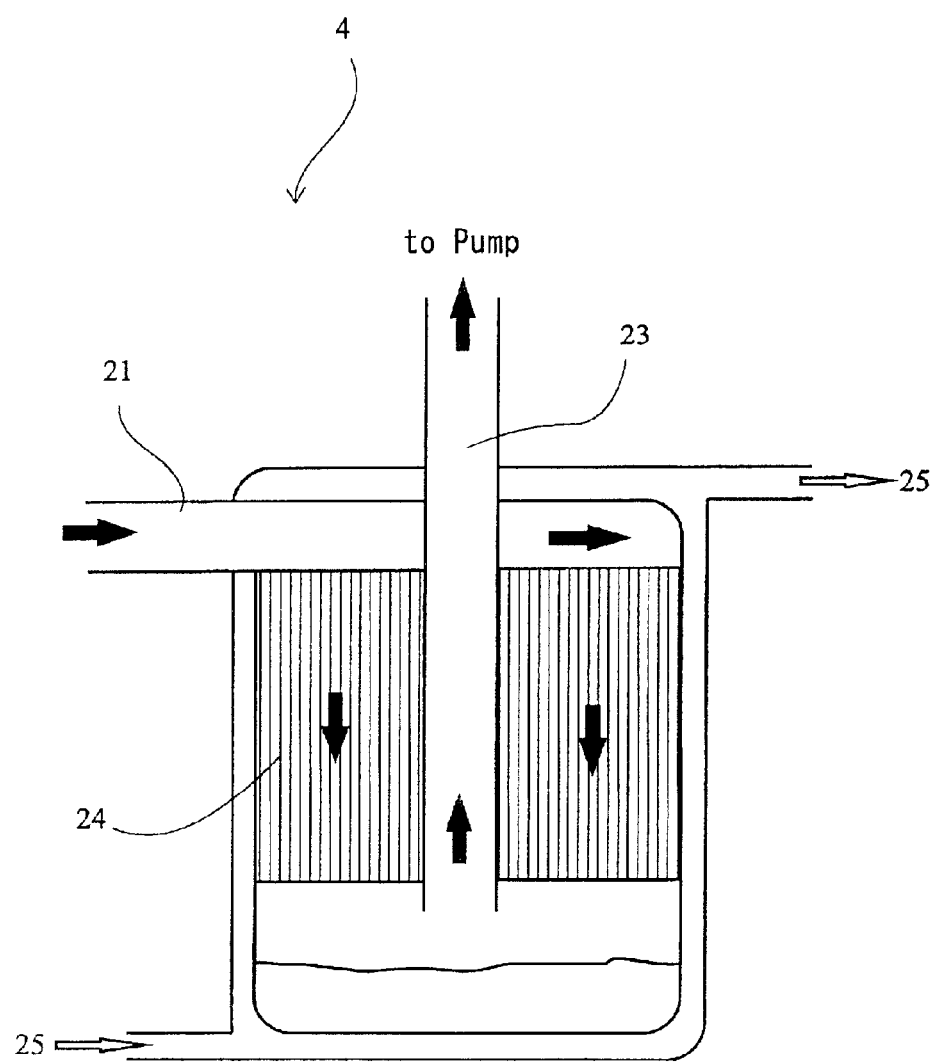
FIG. 3 is a schematic view showing a trap for use in the LPCVD apparatus employed in the present embodiment.

FIG. 3 is used to illustrate in detail the trap 4. As shown in the figure, the trap 4 is so formed that a used raw material gas 22 supplied from the reactor 3 is introduced into the trap 4 through an introduction opening 21 formed on one side of the trap, then discharged upwardly through a center pipe 23. Further, the passage for passing the used raw material gas is filled with an amount of fillers 24 having a honeycomb structure. Here, the material for forming the honeycomb fillers 24 is a stainless steel. In addition, a cooling water 25 is caused to flow along the wall surfaces of the trap 4.

A ruthenium thin film was manufactured with the use of the LPCVD apparatus 1, under conditions indicated below.
Raw material: bis(ethylcyclopentadienyl) ruthenium 200 g
Raw material supply speed: 0.05 g/min
Substrate: Ti-coated Si substrate
Substrate temperature: 300° C.
Pressure within reaction chamber: 133.3 Pa (1.0 torr)
Carrier gas flow rate: 50 mL/min
Reaction gas flow rate: 200 mL/min Here, a coolant (water) is caused to flow over the cooling surfaces of the cold trap 4 so as to cool the gas passing therethrough to a temperature of 10° C. Further, the pressure within the cold trap is continuously monitored and controlled to a value of 133.3 Pa (1.0 torr which is the same pressure as that within the reactor 3) by the pressure regulating valve 8.

The thin film formation process was continued until the raw material was all used up. Upon collecting the recovered components caught in the trap 4, it was found by calculation that the recovered components was 154 g, indicating a recovery rate of 77%.

However, when the recovered components were subjected to distillation at a temperature of 105° C. and a pressure of 46.7 Pa (0.35 torr), 142 g of fractions were recovered, indicating a recovery rate of 71% (with respect to an amount of the original raw material). After the fractions were analyzed in a gas chromatography, it was found that the recovered substance was bis(ethylcyclopentadienyl) ruthenium having a purity of 99.56%.

COMPARATIVE EXAMPLE

Figure 4:
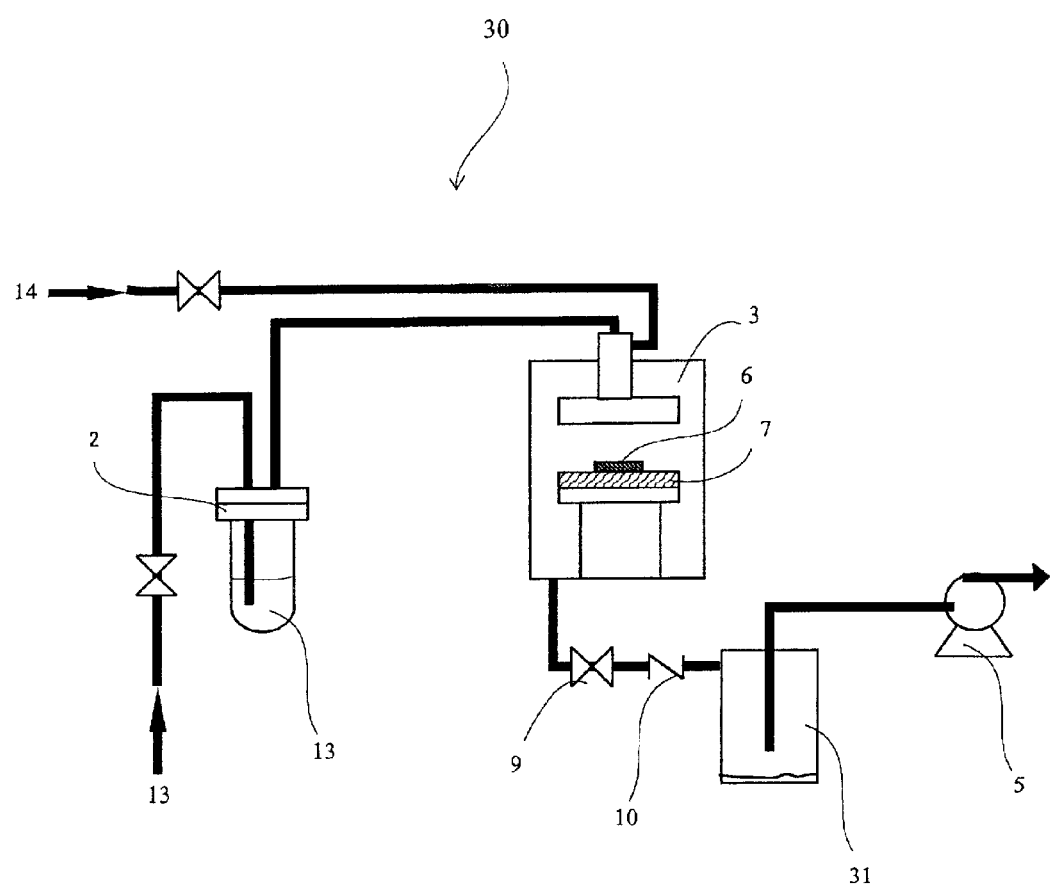
FIG. 4 is a schematic view showing a conventional LPCVD apparatus used in a comparative example.

FIG. 4 is used to illustrate a conventional LPCVD apparatus 30 used in a comparative example. Although the LPCVD apparatus 30 has the same basic structure as that of the LPCVD apparatus 1 used in the above embodiment of the present invention, the structures of their traps are different from each other. This is because the LPCVD apparatus 30 employs only a commonly used trap 31. Moreover, the LPCVD apparatus 30 does not contain the trap pressure regulating valve 8 and the by-pass pipe 12 (including the by-pass shut-off valves 11).

Thereafter, the LPCVD apparatus involved in the comparative example was used to manufacture a thin film of ruthenium under the same condition as in the above embodiment of the present invention.

The internal pressure in the trap in the comparative example was $33 \times 10^{-2}$ Pa, the used raw material collected in the trap was 10 g, indicating a recovery rate of 5%. Thus, it is understood that the recovery rate in the comparative example is lower than that in the above embodiment of the present invention, only because of the following two reasons. The first reason is that the cooling efficiency within the trap in the above embodiment of the present invention is completely different from that in the comparative example. The second reason may be that the internal pressure in the trap in the comparative example is too low, and as a result, the raw material gas fails to be sufficiently condensed at a cooling temperature of 10° C.

What is claimed is:

1. An LPCVD apparatus comprising: a container for accommodating an organometallic compound, said compound serving as a raw material; a heating means for heating the container and vaporizing the organometallic compound to obtain a raw material gas; a reactor for accommodating a substrate on which a thin film is precipitated; an exhaust pump for maintaining a low pressure atmosphere within the reactor; and a trap provided on the upstream of the exhaust pump and cooling used raw material gas supplied from the reactor, wherein said trap is provided with metal honeycomb-structure cylindrical fillers in a flowing passage through which the used raw material flows.

2. The LPCVD apparatus according to claim 1, wherein the length of the honeycomb-structure cylindrical fillers is in a range of 0.01 to 1.0 m in a direction along which the used raw material flows.

3. Th LPCVD apparatus according to claim 1, wherein the honeycomb-structure cylindrical fillers have holes with a maximum diameter of 0.5 to 10.

4. The LPCVD apparatus according to claim 1, wherein said apparatus is provided with a trap-pressure-regulating valve for adjusting the internal pressure in the trap, and the exhaust pump.

5. The LPCVD apparatus according to claim 1, wherein said apparatus is provided with a back-flow valve for preventing a back flow of the used raw material in the trap, said back-flow valve being located between the reactor and the trap.

6. The LPCVD apparatus according to claim 1, wherein said apparatus is connected with a first and a second pipes and provided with a by-pass pipe which bypasses the trap, said first pipe connecting the reactor and the trap and said second pipe connecting the trap and the pump.

7. The LPCVD apparatus according to claim 1, wherein said by-pass pipe is provided at the both ends thereof with a back-flow valve.

* * * * *